(12) United States Patent
Wu

(10) Patent No.: US 6,996,481 B2
(45) Date of Patent: Feb. 7, 2006

(54) RECONSTRUCTION OF TRANSIENT ACOUSTIC RADIATION FROM A FINITE OBJECT SUBJECT TO ARBITRARILY TIME-DEPENDENT EXCITATION

(75) Inventor: Sean F. Wu, Troy, MI (US)

(73) Assignee: Wayne State University, Detroit, MI (US)

( * ) Notice: Subject to any disclaimer, the term of this patent is extended or adjusted under 35 U.S.C. 154(b) by 0 days.

(21) Appl. No.: 10/754,036

(22) Filed: Jan. 8, 2004

(65) Prior Publication Data

US 2005/0150299 A1    Jul. 14, 2005

(51) Int. Cl.
*H04B 15/00*    (2006.01)
*G01S 3/80*    (2006.01)
(52) U.S. Cl. .................... 702/39; 702/138; 367/129
(58) Field of Classification Search ............... 73/587, 73/589, 602, 646; 702/39, 56, 138; 367/129, 367/1, 8.13, 901
See application file for complete search history.

(56) References Cited

U.S. PATENT DOCUMENTS

| | | | | |
|---|---|---|---|---|
| 5,712,805 A | * | 1/1998 | Wang et al. | .......... 702/56 |
| 6,134,968 A | * | 10/2000 | Kunze et al. | .......... 73/589 |
| 6,615,143 B2 | * | 9/2003 | Wu | .......... 702/39 |

OTHER PUBLICATIONS

Search Rt PCT/US2004/043723, Dec. 28, 2004.
Candy J V et al: "Broadband Acoustic Source Processing In A Noisy Shallow Ocean Environment" Oceans '96. MTS/IEEE. Prospects for the 21st Century. Conference Proceedings.
Fort Lauderdale, FL, USA Sep. 23-26, 1996, New York, NY USA, IEEE, US, vol. 1, 23 Sep. 26, 1996. pp. 358-363.
Isakov V et al.: "On Theory and Application of the Helmoltz Equation Least Squares Method In Inverse Acoustics" Inverse Problems IOP Publishing UK, vol. 18, No. 4, Aug. 2002, pp. 1147-01159, Abstract 1147-1148, 1151, 1153-1158 Figure 1.

* cited by examiner

*Primary Examiner*—Hezron Williams
*Assistant Examiner*—Jacques Saint-Surin
(74) *Attorney, Agent, or Firm*—Carlson, Gaskey & Olds

(57) ABSTRACT

General algorithms are developed for reconstructing the acoustic field generated by an arbitrary object subject to an arbitrarily time-dependent excitation. These algorithms enable one to visualize a time-domain acoustic pressure wave as it travels through three-dimensional space. Such a tool can be used to diagnose general noise sources and transmission since in engineering applications most structures are subject to arbitrarily time-dependent excitations. To facilitate the derivations of the temporal solutions, we make use of Laplace transform and expand the acoustic pressure in terms of the spherical Hankel functions and the spherical harmonics. The expansion coefficients are settled by solving an over-determined system of equations obtained by matching the assumed-form solutions to the measured acoustic pressures. To obtain a general expression for a temporal kernel, we replace the spherical Hankel functions by polynomials in s, recast the infinite integral in the inverse Laplace transform as a contour integral in the complex s-plane, and evaluate it via residue theorem. Once this is done, the transient acoustic quantities anywhere including a source surface can be obtained by convoluting the temporal kernels with respect to measured acoustic pressures.

18 Claims, 6 Drawing Sheets t = 3.24 (ms)　　　t = 4.41 (ms)

t = 5.88 (ms)　　　t = 7.35 (ms)

RECONSTRUCTION OF TRANSIENT ACOUSTIC RADIATION FROM A FINITE OBJECT SUBJECT TO ARBITRARILY TIME-DEPENDENT EXCITATION

BACKGROUND OF THE INVENTION

Analyses of transient acoustic radiation are often encountered in engineering applications because most vibrating structures are subject to impulsive or transient force excitations. In many cases, the transient excitations are unspecified and therefore the structural vibration responses are unknown, which makes the analysis of resulting acoustic field difficult. While there are available numerous research papers on predicting transient acoustic radiation from a finite object subject to the given excitations or time-dependent boundary conditions, literature on reconstruction of transient acoustic radiation is almost nonexistent. The closest work is the use of spherical near-field scanning to predict far-field acoustic radiation in the time domain. This scarceness is caused by a lack of an effective methodology to reconstruct transient acoustic radiation based on a limited number of acoustic pressure measurements.

One way of dealing with transient acoustic radiation from an arbitrary object is via the Kirchhoff-Helmholtz integral theory, which correlates the field acoustic pressure to the surface acoustic pressure and normal surface velocity. These surface acoustic quantities are governed by the Kirchhoff-Helmholtz integral equation and must be solved before the field acoustic pressure can be calculated. For an arbitrary surface, this Kirchhoff-Helmholtz integral theory can only be implemented numerically through boundary element method (BEM) by discretizing the surface into elements and interpolating the acoustic quantities on the discrete nodes. Since the acoustic quantities on these nodes have different emission times for an observer in a fixed coordinate system, the integrals become time dependent. Accordingly, one must discretize the integrals in both time and spatial domains, thus making numerical computations extremely time consuming. Needless to say, it will be even more difficult, if possible at all, to apply the Kirchhoff-Helmholtz integral theory to transient reconstruction.

An alternative in transient NAH is to reconstruct the acoustic quantities in the frequency domain first, and then take an inverse Fourier transform to retrieve time domain signals. Transient acoustic radiation from a vibrating object has been reconstructed in this manner. It has been demonstrated that the transient acoustic field can be reconstructed in the frequency domain using the Helmholtz equation least squares (HELS) method, and then taking an inverse Fourier transform to recover the time history of the normal surface velocity response. The infinite integral in the inverse Fourier transform is calculated by direct numerical integration for a vibrating sphere in a free field. Needless to say, the numerical computations involved in this reconstruction process are huge. Therefore, a direct calculation of an inverse Fourier transform to reconstruct transient acoustic radiation is not advisable.

The temporal acoustic field has been reconstructed via the so-called non-stationary spatial transformation of sound field (NS-STSF). NS-STSF is based on the time domain holography (TDH) that processes the acoustic pressures measured by a two-dimensional microphone array with the neighboring microphones separated by half wavelength. TDH "can be seen as a sequence of snapshots of instantaneous pressure over the array area, the time separation between subsequent snapshots being equal to the sampling interval in A/D conversion. Similarly, the output of TDH is a time sequence of snapshots of a selected acoustic quantity in a calculation plane parallel to the measurement plane." So what one sees are acoustic pressure and intensity distributions in the frequency domain at some fixed instants over the measurement time period. As such, NS-STSF is not transient NAH in the sense that it cannot provide a three-dimensional image of an acoustic signal traveling in space and time. Moreover, NS-STSF is very restrictive: it only allows reconstruction of the acoustic quantities on the same grids as the measurement grids on a plane parallel to the measurement plane in a free field.

SUMMARY OF THE INVENTION

In this patent application, we show that transient NAH formulations can be derived using HELS method to visualize a 3D image of an acoustic signal traveling in space and time based on a finite number of acoustic pressure measurements in the field. It is worth mentioning that HELS is valid for arbitrary source surfaces and has been used successfully to reconstruct time-harmonic acoustic radiation in both exterior and interior regions.

First general formulations for reconstructing transient acoustic quantities on an arbitrary surface in a free field are presented. Then general formulations for the temporal kernels to be used in the transient NAH formulations are given. Stability of the solutions thus obtained is then discussed. Numerical examples of reconstructing transient acoustic radiation from various objects are then demonstrated.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF A PREFERRED EMBODIMENT

Figure 1:
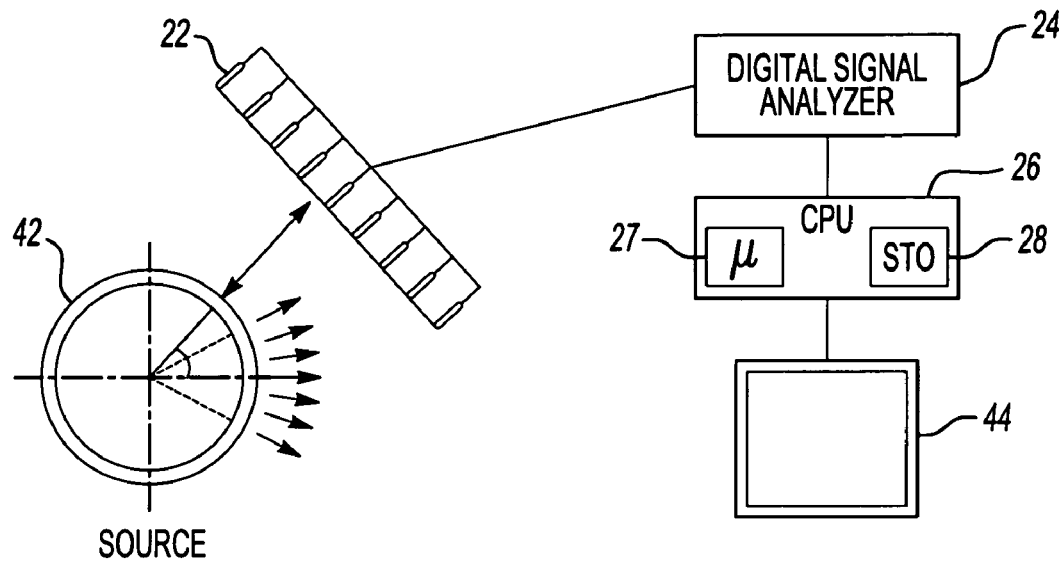
FIG. 1 is a schematic of measurements around an impulsively accelerated sphere.

The acoustic pressure reconstruction system 20 of the present invention is shown schematically in FIG. 1. The system 20 generally comprises a plurality of transducers 22, such as microphones, connected to a signal analyzer 24. Alternatively, a digital sound processing computer board or software algorithm could be used as signal analyzer 24. The system 20 further includes a computer 26 receiving and analyzing the data from the signal analyzer 24. As is well-known, the computer 26 includes a processor 27 operating a computer programs stored on computer storage media 28, which may be one or more of RAM, ROM, hard-drive, CD-ROM, DVD, optical or magnetic media, or any other computer-readable medium. Computer media 28 includes a computer program, which when executed by processor 27 performs the steps described below, including performance of the algorithms of the present invention described below.

In FIG. 1, nine transducers 22 are placed adjacent to the sound source 42, preferably inside an anechoic chamber (not shown). The number of transducers 22 used depends upon the complexity of the shape of the object and the accuracy desired, but at least two transducers 22 are required.

Generally, in operation, the transducers 22 measure the frequency and amplitude of sound from the source 42. The gathered data is sent to the signal analyzer 24 which indicates amplitude as a function of frequency. This frequency/amplitude data is sent to the computer 26. The computer 26 utilizes an inventive method, which will be more fully explained below, to determine the transient acoustic pressure fields generated by the source 42. The computer 26 may display the transient acoustic pressure fields on a display 44. The present invention can be used to diagnose general noise sources and transmission since in engineering most structures are subject to arbitrarily time-dependent excitations.

Transient HELS Formulations

Consider transient acoustic radiation from a sphere in a free field of density $\rho_0$ and speed of sound c. Assume that the sphere is excited at $t=t_0$ and prior to that the acoustic pressure at any point is zero, i.e., $p(x;t)=0$ at $t<t_0$. Our objective is to reconstruct the transient acoustic quantities everywhere, including the source surface, based on acoustic pressure signals measured on a conformal surface $\Gamma$ around the source. To this end, let us first define the Laplace transform pair for a function $f(x;t)$ as $$F(x;s) = \int_0^\infty f(x;t)e^{-st}dt \text{ and } f(x;t) = \frac{1}{i2\pi}\int_{\varepsilon-i\infty}^{\varepsilon+i\infty} F(x;s)e^{st}ds \quad (1)$$

where s is a complex variable in the Laplace or s-domain, $\varepsilon$ is a real constant that is greater than the real parts of all singularities of $F(x;s)$. Note that the function $f(x;t)$ in Eq. (1) satisfies the condition $$\int_0^\infty |f(x;t)e^{-\sigma t}|dt < \infty$$

for some finite real value of $\sigma$, and $\varepsilon$ is strategically placed to ensure that the real parts of all singularities of $F(x;s)$ fall on the left-half s-plane so the result is bounded as $t\to\infty$. Accordingly, we can express the acoustic pressure in the s-domain as an expansion, which can be written under the spherical coordinates as $$P(r,\theta,\phi;s) = \sum_{n=0}^{N}\sum_{l=-n}^{n} h_n(\beta)Y_n^l(\theta,\phi)C_{nl}(s), \quad (2)$$

where $\beta=isr/c$, $h_n(\beta)$ are the spherical Hankel functions of order n of the first kind, $Y_n^l(\theta,\phi)$ are the spherical harmonics, and the expansion coefficients $C_{nl}(s)$ are specified by solving an over-determined system of equations obtained by matching the assumed-form solution (2) to the acoustic pressures measured on a surface enclosing the source at $x^\Gamma \equiv \{x_m^\Gamma\}^T \in \Gamma$, m=1 to M, where M>J, here $J=(1+N)^2$ indicates the maximum number of expansion terms in (2).

$$P(x^\Gamma;s)=\Psi(x^\Gamma;s)C(s), \quad (3)$$

where $P(x^\Gamma;s)$ and $C(s)$ represent the column vectors containing measured acoustic pressures and expansion coefficients, respectively, and $\Psi(x^\Gamma;s)$ is the matrix whose elements are given by $\Psi_{nl}(r_m^\Gamma,\theta_m^\Gamma,\phi_m^\Gamma;s)=h_n(\beta_m^\Gamma)Y_n^l(\theta_m^\Gamma,\phi_m^\Gamma)$. The expansion coefficients $C(s)$ in (3) can be solved as $$C(s)=\Psi(x^\Gamma;s)^\dagger P(x^\Gamma;s), \quad (4)$$

where $\Psi(x^\Gamma;s)^\dagger=[\Psi(x^\Gamma;s)^H\Psi(x^\Gamma;s)]^{-1}\Psi(x^\Gamma;s)^H$ is known as pseudo inversion of $\Psi(x^\Gamma;s)$ with a superscript H indicating a conjugate transpose. Once $C(s)$ are specified the acoustic pressure on a source surface $x_0 \in S_0$ or anywhere else can be reconstructed, $$P(x_0;s)=G^p(x_0|x^\Gamma;s)P(x^\Gamma;s), \quad (5)$$

where $G^p(x_0|x^\Gamma;s)=\Psi(x_0;s)\Psi(x^\Gamma;s)^\dagger$ is the transfer matrix for reconstructing acoustic pressure.

The normal surface velocity of a source can then be obtained via the Euler's equation $$V(x_0;s)=G^v(x_0|x^\Gamma;s)P(x^\Gamma;s), \quad (6)$$

where $G^v(x_0|x^\Gamma;s)=\Phi(x_0;s)\Psi(x^\Gamma;s)^\dagger$ is the transfer matrix for reconstructing the normal surface velocity, here $\Phi(x_0;s)=(i\rho_0 c)^{-1}\partial\Psi(x_0;s)/\partial\eta_0$ with $\eta_0$ being the unit normal on a source surface and $\rho_0 c$ the characteristic impedance of the fluid medium.

The time-domain acoustic pressure and normal component of velocity on a source surface $x_0 \equiv (r_0,\theta_0,\phi_0)$ can be obtained by taking an inverse Laplace transform of (5) and (6), which is expressible as a convolution in time domain.

$$p(x_0;t) = \sum_{j=1}^{J}\sum_{m=1}^{M} g_{jm}^p(x_0|x_m^\Gamma;t) \circ p_j(x_m^\Gamma;t), \quad (7)$$

$$v(x_0;t) = \sum_{j=1}^{J}\sum_{m=1}^{M} g_{jm}^v(x_0|x_m^\Gamma;t) \circ p_j(x_m^\Gamma;t), \quad (8)$$

where $x_m^\Gamma \in \Gamma$, m=1 to M, and the temporal kernels $g_{jm}^p(x_0|x_m^\Gamma;t)$ and $g_{jm}^v(x_0|x_m^\Gamma;t)$ are given by $$g_{jm}^p(x_0|x_m^\Gamma;t) = \frac{1}{i2\pi}\int_{\varepsilon-i\infty}^{\varepsilon+i\infty} G_{jm}^p(x_0|x_m^\Gamma;s)e^{st}ds, \quad (9a)$$

$$g_{jm}^v(x_0|x_m^\Gamma;t) = \frac{1}{i2\pi}\int_{\varepsilon-i\infty}^{\varepsilon+i\infty} G_{jm}^v(x_0|x_m^\Gamma;s)e^{st}ds. \quad (9b)$$

Needless to say, the temporal acoustic quantities anywhere in the field can be obtained by substituting the coordinates at $x_0$ in Eqs. (7) and (8) by those at $x \equiv (r,\theta,\phi)$.

Evaluation of Temporal Kernals

The integrands in Eqs. (9a) and (9b) are given by $G_{jm}^p(x_0|x_m^\Gamma;s)=\Psi_j(x_0;s)\Psi_j(x_m^\Gamma;s)^\dagger$ and $G_{jm}^v(x_0|x_m^\Gamma;s)=\Phi_j(x_0;s)\Psi_j(x_m^\Gamma;s)^\dagger$, and the functions $\Psi_j(x;s)=\Psi_{nl}(r,\theta,\phi;s)=h_n(\beta)Y_n^l(\theta,\phi)$ and $\Phi_j \equiv \Phi_{nl}(x;s)=(i\rho_0 c)^{-1}\partial/\partial\eta[h_n(\beta)Y_n^l(\theta,\phi)]$, where the indices j, n, and l are related together through $j=n^2+n+l+1$, with n increasing from 0 to N and l from −n to n.

To facilitate evaluations of the temporal kernels, we recast the infinite integrals in Eq. (9) into contour integrals.

$$g_{jm}^P(x_0 \mid x_m^\Gamma; t) = \frac{1}{i2\pi} \oint_l G_{jm}^P(x_0 \mid x_m^\Gamma; s) e^{st} ds, \quad (10a)$$

$$g_{jm}^v(x_0 \mid x_m^\Gamma; t) = \frac{1}{i2\pi} \oint_l G_{jm}^v(x_0 \mid x_m^\Gamma; s) e^{st} ds, \quad (10b)$$

where the contour l consists of a straight line from $\epsilon - iR$ to $\epsilon + iR$ and a semicircle of radius R in the left-half s-plane in a counterclockwise direction. The contribution of this integral from semicircle is zero as $R \to \infty$. This is obvious if we notice that the integrands in Eq. (10) contain the factor $e^{-(ct+r^\Gamma - r_0)R \cos\gamma/c}$ that decays exponentially as $R \to \infty$ since $t > 0$ and $r^\Gamma > r_0$, where $r^\Gamma$ and $r_0$ are the radii of source $S_0$ and measurement $\Gamma$ surfaces, respectively, and $\gamma$ is the polar angle with respect to the real axis for a point on the semicircle. The contour integrals in (10) can be evaluated using the residue theory. To this end, we replace the spherical Hankel functions and their derivatives in $G_{jm}^P(x_0 \mid x_m^\Gamma; s)$ and $G_{jm}^v(x_0 \mid x_m^\Gamma; s)$ by polynomials of s $$h_n\left(\frac{ir}{c}s\right) = -e^{-rs/c} \sum_{q=0}^{n} \frac{(n+q)!}{i^n 2^q q!(n-q)!} \left(\frac{c}{r}\right)^{q+1} \frac{1}{s^{q+1}}, \quad (11a)$$

$$h_n\left(\frac{ir}{c}s\right) = e^{-rs/c} \sum_{q=0}^{n} \frac{(n+q)![(rs/c)+(q+1)]}{i^n 2^q q!(n-q)!} \left(\frac{c}{r}\right)^{q+1} \frac{1}{s^{q+2}}. \quad (11a)$$

Substitute Eq. (11) into $G_{jm}^P(x_0 \mid x_m^\Gamma; s)$ and $G_{jm}^v(x_0 \mid x_m^\Gamma; s)$, use partial expansion to recast the polynomial into simple poles, and sum them up in terms of simple real and complex poles. Doing so, we obtain $$G_{jm}^P(x_0 \mid x_m^\Gamma; s) = \Psi_j(x_0; s) \Psi_j(x_m^\Gamma; s)^\dagger = \quad (12a)$$

$$e^{(r_m^\Gamma - r_0)s/c} \left[ \sum_{q=0}^{Q_{jm}^P - 1} \frac{\Pi_{jm}^P(s_{jm}^P)_q}{s - (s_{jm}^P)_q} + \sum_{q=0}^{\hat{Q}_{jm}^P - 1} \frac{\hat{\Pi}_{jm}^P(\hat{s}_{jm}^P)_q}{s^2 - 2\mathrm{Re}(\hat{s}_{jm}^P)_q s + |\hat{s}_{jm}^P|_q^2} \right],$$

$$G_{jm}^v(x_0 \mid x_m^\Gamma; s) = \Phi_j(x_0; s) \Psi_j(x_m^\Gamma; s)^\dagger = \quad (12b)$$

$$e^{(r_m^\Gamma - r_0)s/c} \left[ \sum_{q=0}^{Q_{jm}^{v,r} - 1} \frac{\Pi_{jm}^{v,r}(s_{jm}^{v,r})_q}{s - (s_{jm}^{v,r})_q} + \sum_{q=0}^{\hat{Q}_{jm}^{v,r} - 1} \frac{\hat{\Pi}_{jm}^{v,r}(\hat{s}_{jm}^{v,r})_q}{s^2 - 2\mathrm{Re}(\hat{s}_{jm}^{v,r})_q s + |\hat{s}_{jm}^{v,r}|_q^2} \right]$$

$$\eta_0 \cdot e_r +$$

$$e^{(r_m^\Gamma - r_0)s/c} \left[ \sum_{q=0}^{Q_{jm}^{v,\theta} - 1} \frac{\Pi_{jm}^{v,\theta}(s_{jm}^{v,\theta})_q}{s - (s_{jm}^{v,\theta})_q} + \sum_{q=0}^{\hat{Q}_{jm}^{v,\theta} - 1} \frac{\hat{\Pi}_{jm}^{v,\theta}(\hat{s}_{jm}^{v,\theta})_q}{s^2 - 2\mathrm{Re}(\hat{s}_{jm}^{v,\theta})_q s + |\hat{s}_{jm}^{v,\theta}|_q^2} \right]$$

$$\eta_0 \cdot e_\theta + e^{(r_m^\Gamma - r_0)s/c} \left[ \sum_{q=0}^{Q_{jm}^{v,\phi} - 1} \frac{\Pi_{jm}^{v,\phi}(s_{jm}^{v,\phi})_q}{s - (s_{jm}^{v,\phi})_q} + \right.$$

$$\left. \sum_{q=0}^{\hat{Q}_{jm}^{v,\phi} - 1} \frac{\hat{\Pi}_{jm}^{v,\phi}(\hat{s}_{jm}^{v,\phi})_q}{s^2 - 2\mathrm{Re}(\hat{s}_{jm}^{v,\phi})_q s + |\hat{s}_{jm}^{v,\phi}|_q^2} \right] \eta_0 \cdot e_\phi$$

where $(s_{jm}^P)_q$ and $(\hat{s}_{jm}^P)_q$ denote the qth simple real and complex poles for reconstructing surface acoustic pressure, respectively, $\Pi_{jm}^P(s_{jm}^P)_q$ and $\Pi_{jm}^P(\hat{s}_{jm}^P)_q$ stand for the residues that correspond to $(s_{jm}^P)_q$ and $(\hat{s}_{jm}^P)_q$, respectively, $Q_{jm}^P$ and $\hat{Q}_{jm}^P$ are total numbers of simple real and complex poles for $G_{jm}^P(x_0 \mid x_m^\Gamma; s)$. Similarly, $(s_{jm}^{v,r})_q$ and $(\hat{s}_{jm}^{v,r})_q$ indicate the qth simple real and complex poles for reconstructing the r-component of the surface velocity, respectively, $\Pi_{jm}^{v,r}(s_{jm}^{v,r})_q$ and $\Pi_{jm}^{v,r}(\hat{s}_{jm}^{v,r})_q$ represent the residues that correspond to $(s_{jm}^{v,r})_q$ and $(\hat{s}_{jm}^{v,r})_q$, respectively, and $Q_{jm}^{v,r}$ and $\hat{Q}_{jm}^{v,r}$ are total numbers of simple poles for the r-component of $G_{jm}^v(x_0 \mid x_m^\Gamma; s)$. The qth real and complex poles, residues, and numbers of poles for reconstructing the θ-component of the surface velocity are defined as $(s_{jm}^{v,\theta})_q$, $(\hat{s}_{jm}^{v,\theta})_q$, $\Pi_{jm}^{v,\theta}(s_{jm}^{v,\theta})_q$, $\Pi_{jm}^{v,\theta}(\hat{s}_{jm}^{v,\theta})_q$, $Q_{jm}^{v,\theta}$, and $\hat{Q}_{jm}^{v,\theta}$, respectively. The qth real and complex poles, residues, and numbers of poles for reconstructing the φ-component of the surface velocity are given by $(s_{jm}^{v,\phi})_q$, $(\hat{s}_{jm}^{v,\phi})_q$, $\Pi_{jm}^{v,\phi}(s_{jm}^{v,\phi})_q$, $\Pi_{jm}^{v,\phi}(\hat{s}_{jm}^{v,\phi})_q$, $Q_{jm}^{v,\phi}$, and $\hat{Q}_{jm}^{v,\phi}$, respectively.

The general solutions for the temporal kernels can now be obtained by multiplying sums of the residues by $i2\pi$.

$$g_{jm}^P(x_0 \mid x_m^\Gamma; t) = \left[ \sum_{q=0}^{Q_{jm}^P - 1} \Pi_{jm}^P(s_{jm}^P)_q e^{-(s_{jm}^P)_q t} + \right. \quad (13a)$$

$$\left. \sum_{q=0}^{\hat{Q}_{jm}^P - 1} \frac{\sin(\mathrm{Im}(\hat{s}_{jm}^P)_q t)}{\mathrm{Im}(\hat{s}_{jm}^P)_q} \hat{\Pi}_{jm}^P(\hat{s}_{jm}^P)_q e^{-\mathrm{Re}(\hat{s}_{jm}^P)_q t} \right] H\left(t - \frac{r_m^\Gamma - r_0}{c}\right),$$

$$g_{jm}^v(x_0 \mid x_m^\Gamma; t) = \left[ \sum_{q=0}^{Q_{jm}^{v,r} - 1} \Pi_{jm}^{v,r}(s_{jm}^{v,r})_q e^{-(s_{jm}^{v,r})_q t} + \right. \quad (13b)$$

$$\left. \sum_{q=0}^{\hat{Q}_{jm}^{v,r} - 1} \frac{\sin(\mathrm{Im}(\hat{s}_{jm}^{v,r})_q t)}{\mathrm{Im}(\hat{s}_{jm}^{v,r})_q} \hat{\Pi}_{jm}^{v,r}(\hat{s}_{jm}^{v,r})_q e^{-\mathrm{Re}(\hat{s}_{jm}^{v,r})_q t} \right]$$

$$H\left(t - \frac{r_m^\Gamma - r_0}{c}\right) \eta_0 \cdot e_r + \left[ \sum_{q=0}^{Q_{jm}^{v,\theta} - 1} \Pi_{jm}^{v,\theta}(s_{jm}^{v,\theta})_q e^{-(s_{jm}^{v,\theta})_q t} + \right.$$

$$\left. \sum_{q=0}^{\hat{Q}_{jm}^{v,\theta} - 1} \frac{\sin(\mathrm{Im}(\hat{s}_{jm}^{v,\theta})_q t)}{\mathrm{Im}(\hat{s}_{jm}^{v,\theta})_q} \hat{\Pi}_{jm}^{v,\theta}(\hat{s}_{jm}^{v,\theta})_q e^{-\mathrm{Re}(\hat{s}_{jm}^{v,\theta})_q t} \right]$$

$$H\left(t - \frac{r_m^\Gamma - r_0}{c}\right) \eta_0 \cdot e_\theta + \left[ \sum_{q=0}^{Q_{jm}^{v,\phi} - 1} \Pi_{jm}^{v,\phi}(s_{jm}^{v,\phi})_q e^{-(s_{jm}^{v,\phi})_q t} + \right.$$

$$\left. \sum_{q=0}^{\hat{Q}_{jm}^{v,\phi} - 1} \frac{\sin(\mathrm{Im}(\hat{s}_{jm}^{v,\phi})_q t)}{\mathrm{Im}(\hat{s}_{jm}^{v,\phi})_q} \hat{\Pi}_{jm}^{v,\phi}(\hat{s}_{jm}^{v,\phi})_q e^{-\mathrm{Re}(\hat{s}_{jm}^{v,\phi})_q t} \right]$$

$$H\left(t - \frac{r_m^\Gamma - r_0}{c}\right) \eta_0 \cdot e_\phi$$

where $H(t - r_m^\Gamma - r_0/c)$ is the Heaviside step function.

Equation (13) illustrates that the temporal kernels consist of the components of weighting functions. In particular, the first group of terms in the square brackets of Eq. (13) that result from simple real poles $(s_{jm}^P)_q$, $(s_{jm}^{v,r})_q$, $(s_{jm}^{v,\theta})_q$, and $(s_{jm}^{v,\phi})_q$ decay exponentially in time. While the second group of terms resulting from simple complex poles $(\hat{s}_{jm}^P)_q$, $(\hat{s}_{jm}^{v,r})_q$, $(\hat{s}_{jm}^{v,\theta})_q$, and $(\hat{s}_{jm}^{v,\phi})_q$ oscillate sinusoidally, with their amplitudes decaying exponentially in time and decreasing as the angular frequency increases. The real parts of complex poles $\text{Re}(\hat{s}_{jm}^P)_q$, $\text{Re}(\hat{s}_{jm}^{v,r})_q$, $\text{Re}(\hat{s}_{jm}^{v,\theta})_q$, and $\text{Re}(\hat{s}_{jm}^{v,\phi})_q$ dictate the rates at which the weighting functions decay exponentially in time, and the imaginary parts $\text{Im}(\hat{s}_{jm}^P)_q$, $\text{Im}(\hat{s}_{jm}^{v,r})_q$, $\text{Im}(\hat{s}_{jm}^{v,\theta})_q$, and $\text{Im}(\hat{s}_{jm}^{v,\phi})_q$ depict the angular frequencies of the weighting functions. When the temporal kernels given by Eq. (13) are convoluted with measured acoustic pressure signals, we see transient acoustic pressure waves whose amplitudes decay exponentially in time as they travel in space.

Stability of Solutions

As in all inverse problems, we must face the ill-posedness difficulty in reconstructing the temporal acoustic quantities. In time-harmonic NAH, this ill-posedness problem is dealt with via regularization that smoothes the dependence of solution on the input data. A common approach is to employ Tikhonov regularization (TR) with certain parameter choice method together with singular value decomposition (SVD). The objective of TR is to strike a balance between minimal residues and minimal solution norms. The purpose of SVD is to identify and eliminate the small singular values that may amplify the errors embedded in the input data and cause distortion in the reconstructed images.

In transient NAH regularization can be accomplished by eliminating the simple poles that stay close to the imaginary axis. Since the contour integral is carried out in the left-half s-plane, the real part of a simple pole is negative and the amplitude of the corresponding temporal kernel decays exponentially in time. This guarantees the stability of temporal solutions. However, when a simple pole approaches the imaginary axis, its real part diminishes and the amplitude of the corresponding temporal kernel decays very slowly. Under this condition, the errors embedded in the input data remain finite and get transferred to the reconstructed acoustic quantities.

To circumvent this difficulty, we propose a low-pass filter to eliminates all simple poles whose real parts are larger than certain tolerance $\epsilon$. In this way, the amplitude of the acoustic pressure remains finite as the wave propagates in space and time. Accordingly, we can rewrite Eq. (12) as $$G_{jm}^P(x_0 \mid x_m^\Gamma; s) = \qquad (14a)$$

$$e^{(r_m^\Gamma - r_0)s/c} \left[ \sum_{q=0}^{\Theta_{jm}^P - 1} \frac{\Pi_{jm}^P(s_{jm}^P)_q}{s - (s_{jm}^P)_q} + \sum_{q=0}^{\hat{\Theta}_{jm}^P - 1} \frac{\hat{\Pi}_{jm}^P(\hat{s}_{jm}^P)_q}{s^2 - 2\text{Re}(\hat{s}_{jm}^P)_q s + |\hat{s}_{jm}^P|_q^2} \right],$$

$$G_{jm}^v(x_0 \mid x_m^\Gamma; s) = \qquad (14b)$$

$$e^{(r_m^\Gamma - r_0)s/c} \left[ \sum_{q=0}^{\Theta_{jm}^{v,r} - 1} \frac{\Pi_{jm}^{v,r}(s_{jm}^{v,r})_q}{s - (s_{jm}^{v,r})_q} + \sum_{q=0}^{\hat{\Theta}_{jm}^{v,r} - 1} \frac{\hat{\Pi}_{jm}^{v,r}(\hat{s}_{jm}^{v,r})_q}{s^2 - 2\text{Re}(\hat{s}_{jm}^{v,r})_q s + |\hat{s}_{jm}^{v,r}|_q^2} \right]$$

$$\eta_0 \cdot e_r +$$

$$e^{(r_m^\Gamma - r_0)s/c} \left[ \sum_{q=0}^{\Theta_{jm}^{v,\theta} - 1} \frac{\Pi_{jm}^{v,\theta}(s_{jm}^{v,\theta})_q}{s - (s_{jm}^{v,\theta})_q} + \sum_{q=0}^{\hat{\Theta}_{jm}^{v,\theta} - 1} \frac{\hat{\Pi}_{jm}^{v,\theta}(\hat{s}_{jm}^{v,\theta})_q}{s^2 - 2\text{Re}(\hat{s}_{jm}^{v,\theta})_q s + |\hat{s}_{jm}^{v,\theta}|_q^2} \right]$$

$$\eta_0 \cdot e_\theta + e^{(r_m^\Gamma - r_0)s/c} \left[ \sum_{q=0}^{\Theta_{jm}^{v,\phi} - 1} \frac{\Pi_{jm}^{v,\phi}(s_{jm}^{v,\phi})_q}{s - (s_{jm}^{v,\phi})_q} + \right.$$

$$\left. \sum_{q=0}^{\hat{\Theta}_{jm}^{v,\phi} - 1} \frac{\hat{\Pi}_{jm}^{v,\phi}(\hat{s}_{jm}^{v,\phi})_q}{s^2 - 2\text{Re}(\hat{s}_{jm}^{v,\phi})_q s + |\hat{s}_{jm}^{v,\phi}|_q^2} \right] \eta_0 \cdot e_\phi,$$

where $\Theta_{jm}^P$ and $\Theta_{jm}^P$ are total numbers of the principal simple poles for reconstructing surface acoustic pressure, $\Theta^{jm,v}$ and $\Theta_{jm}^v$ are those of the principal simple poles for reconstructing normal surface velocity in the time domain, and the rest simple poles whose real parts are larger than $\epsilon$ are eliminated. Thus this low-pass filter expands the acoustic field in terms of the acoustic modes that are bounded in the time domain, which is equivalent to what truncated SVD does for time-harmonic NAH applications. The regularized temporal kernels can then be written as $$g_{jm}^P(x_0 \mid x_m^\Gamma; t) = \left[ \sum_{q=0}^{\Theta_{jm}^P - 1} \prod_{jm}^P (s_{jm}^P)_q e^{-(s_{jm}^P)_q t} + \right. \qquad (15a)$$

$$\left. \sum_{q=0}^{\hat{\Theta}_{jm}^P - 1} \frac{\sin(\text{Im}(\hat{s}_{jm}^P)_q t)}{\text{Im}(\hat{s}_{jm}^P)_q} \prod_{jm}^{\hat{P}} (\hat{s}_{jm}^P)_q e^{-\text{Re}(\hat{s}_{jm}^P)_q t} \right]$$

$$H\left(t - \frac{r_m^\Gamma - r_0}{c}\right),$$

$$g_{jm}^v(x_0 \mid x_m^\Gamma; t) = \left[ \sum_{q=0}^{\Theta_{jm}^v - 1} \prod_{jm}^v (s_{jm}^v)_q e^{-(s_{jm}^v)_q t} + \right. \qquad (15b)$$

$$\left. \sum_{q=0}^{\hat{\Theta}_{jm}^v - 1} \frac{\sin(\text{Im}(\hat{s}_{jm}^v)_q t)}{\text{Im}(\hat{s}_{jm}^P)_q} \prod_{jm}^{\hat{v}} (\hat{s}_{jm}^v)_q e^{-\text{Re}(\hat{s}_{jm}^v)_q t} \right]$$

$$H\left(t - \frac{r_m^\Gamma - r_0}{c}\right).$$

Numerical Examples

In this section, we use the transient NAH formulations (7) and (8) derived in above to reconstruct the transient acoustic quantities generated by a sphere. To facilitate validations of the reconstructed field, we consider a sphere of radius $r_0=1$ m subject to an impulsive excitation for which the analytic solution is readily available.

$$v(r_0,\theta_0,\phi_0;t) = \hat{v}(r_0,\theta_0,\phi_0)H(t-t_0), \qquad (16)$$

where $\hat{v}(r_0,\theta_0,\phi_0)$ is the unknown amplitude of the normal velocity on the source surface.

In these examples, the measured acoustic pressures are generated analytically along a line segment that intersects at 135° with respect to the x-axis with a minimum distance of d=0.1 m (see FIG. 1) These acoustic pressures are taken as the input to Eqs. (7) and (8) to reconstruct the surface acoustic pressures and the normal surface velocities in the time domain, which are then compared with the analytic results.

Explosively Expanding Sphere

The first example deals with reconstruction of the transient acoustic field generated by an explosively expanding sphere in free space. One can view such a transient acoustic field as being produced by an explosion. Since the field is spherically symmetric, the dimensionless acoustic pressure depends only on the radial distance and time and the analytic solution is given by $$\frac{p(r;t)}{\rho_0 cv} = \frac{ae^{-(ct-r)/a}}{r} H\left(t - \frac{r}{c}\right). \quad (17)$$

Equation (17) is used to generate 24 field acoustic pressures, which are taken as input to Eqs. (7) and (8) to reconstruct the transient acoustic field. Test results show that solutions given by Eqs. (7) and (8) converge very rapidly. This is no surprise since the acoustic field is produced by the zeroth order of the spherical Hankel function. As a result, satisfactory reconstruction can be obtained without using regularization.

Table 1 illustrates comparison of the first eleven reconstructed expansion coefficients and the exact ones. For consistency, we show comparison of first eleven expansion coefficients in all cases. Results show that the transient acoustic field produced by an explosively expanding sphere in a field can be reconstructed using one expansion function (or taking one measurement).

TABLE 1

Comparison of coefficients $\zeta_j$ for an explosively expanding sphere.

| $\zeta_j$ | Reconstructed values | Analytic Values |
| --- | --- | --- |
| $\zeta_1$ | 9.99999E−01 | 1.0 |
| $\zeta_2$ | 2.16846E−16 | 0.0 |
| $\zeta_3$ | 5.99974E−16 | 0.0 |
| $\zeta_4$ | −2.41091E−16 | 0.0 |
| $\zeta_5$ | 3.58611E−16 | 0.0 |
| $\zeta_6$ | 2.62832E−16 | 0.0 |
| $\zeta_7$ | −5.34793E−16 | 0.0 |
| $\zeta_8$ | −4.50502E−16 | 0.0 |
| $\zeta_9$ | 4.49696E−16 | 0.0 |
| $\zeta_{10}$ | 1.87202E−16 | 0.0 |
| $\zeta_{11}$ | −3.71210E−16 | 0.0 |

Figure 2:
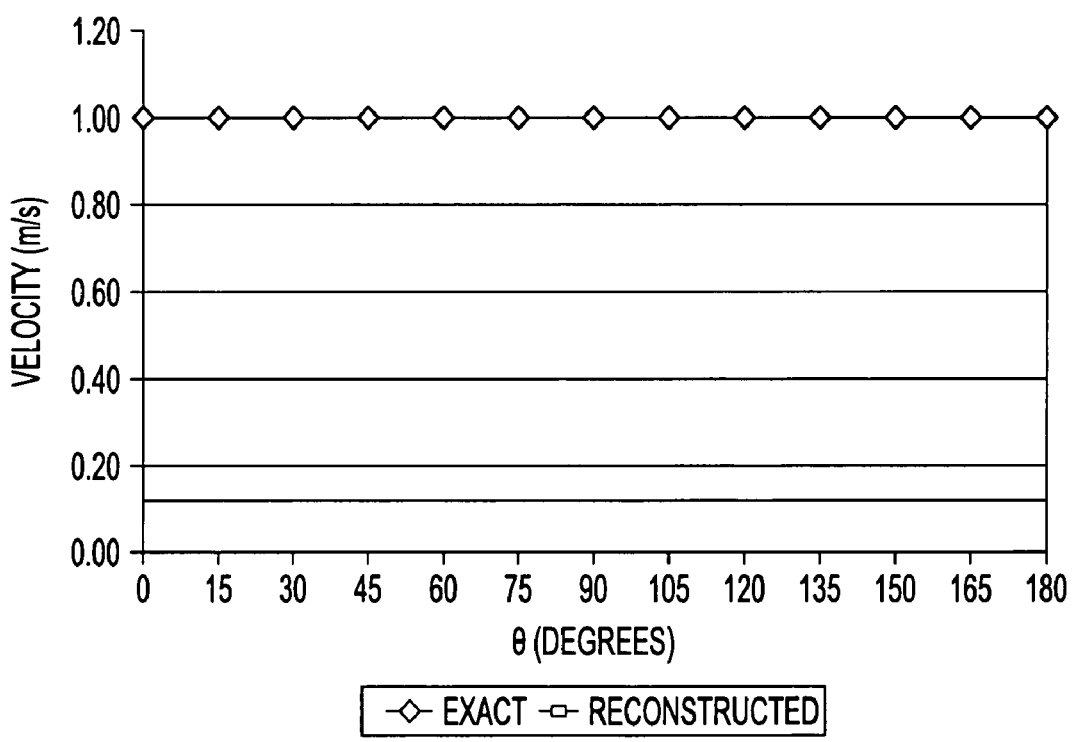
FIG. 2 is a comparison of the exact and reconstructed normal surface velocity distributions on the surface of an explosively expanding sphere.
Figure 3:
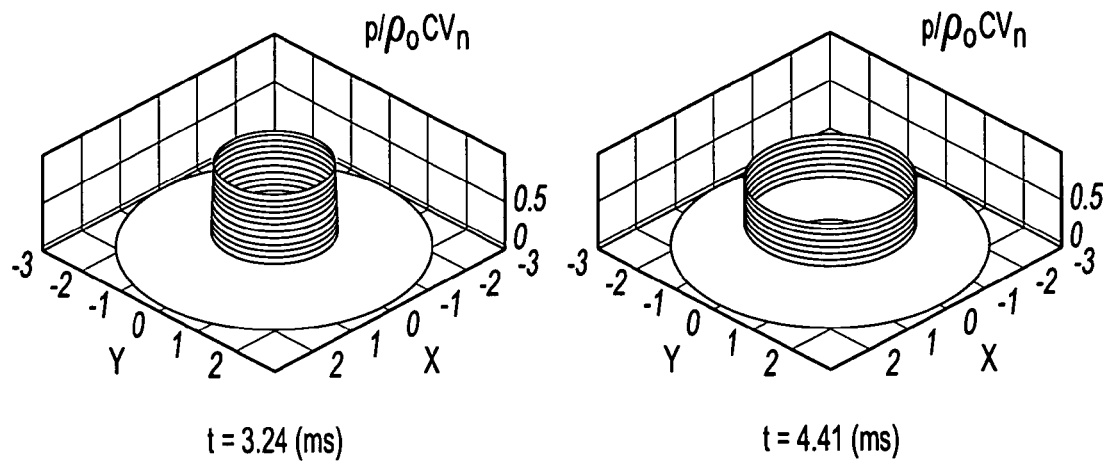
FIG. 3 shows the transient acoustic pressure fields generated by an explosively expanding sphere.
Figure 3:
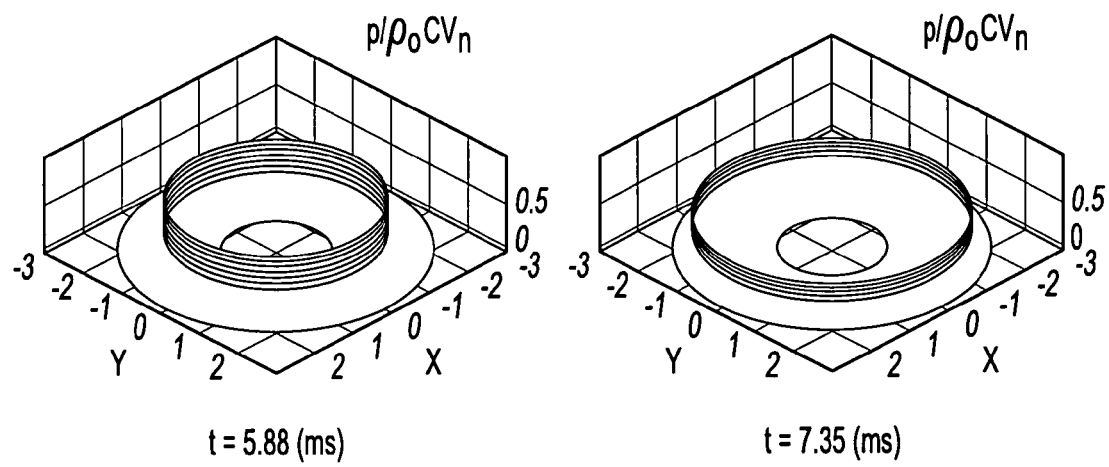

FIG. 2 exhibits the comparison of the reconstructed and exact normal surface velocities. Once the normal surface velocity is determined, the radiated acoustic pressure at any instant and any location can be reconstructed. FIG. 3 shows three-dimensional images of the instantaneous acoustic pressure distribution at t=3.24 (ms), 4.41 (ms), 5.88 (ms), and 7.35 (ms) resulting from a sphere that explodes at t=0 (sec).

Impulsively Accelerated Sphere

The second example concerns reconstruction of the transient acoustic field resulting from an impulsively accelerated sphere in a free field. One can view this as a crack on a baseball. The analytic solution for the temporal acoustic pressure generated by this sphere is given by $$\frac{p(r, \theta; t)}{\rho_0 cv} = \frac{a\cos\theta}{r} e^{-(ct-r)/a} H\left(t - \frac{r}{c}\right)\left[\cos\left(\frac{ct-r}{a}\right) - \left(1 - \frac{a}{r}\right)\sin\left(\frac{ct-r}{a}\right)\right], \quad (18)$$

where $\cos\theta = \eta \cdot e_R$, here $e_R$ is the unit vector in the direction of wave propagation from the source to the receiver. As in the first case, we collect 24 input data and use them in Eqs (7) and (8) to reconstruct the acoustic field. Table 2 shows comparison of the reconstructed expansion coefficients and the exact ones for an impulsively accelerating sphere. It is seen that in this case all coefficients are zero except the second one and excellent agreement is obtained.

TABLE 2

Comparison of coefficients $\zeta_j$ for an impulsively accelerating sphere.

| $\zeta_j$ | Reconstructed values | Analytic Values |
| --- | --- | --- |
| $\zeta_1$ | 3.98736E−17 | 0.0 |
| $\zeta_2$ | 9.99999E−01 | 1.0 |
| $\zeta_3$ | −1.06066E−16 | 0.0 |
| $\zeta_4$ | 3.24818E−11 | 0.0 |
| $\zeta_5$ | 1.97787E−16 | 0.0 |
| $\zeta_6$ | −3.32822E−10 | 0.0 |
| $\zeta_7$ | −1.05409E−17 | 0.0 |
| $\zeta_8$ | 3.70379E−10 | 0.0 |
| $\zeta_9$ | −1.60172E−16 | 0.0 |
| $\zeta_{10}$ | −1.02017E−11 | 0.0 |
| $\zeta_{11}$ | 8.92684E−17 | 0.0 |

Figure 4:
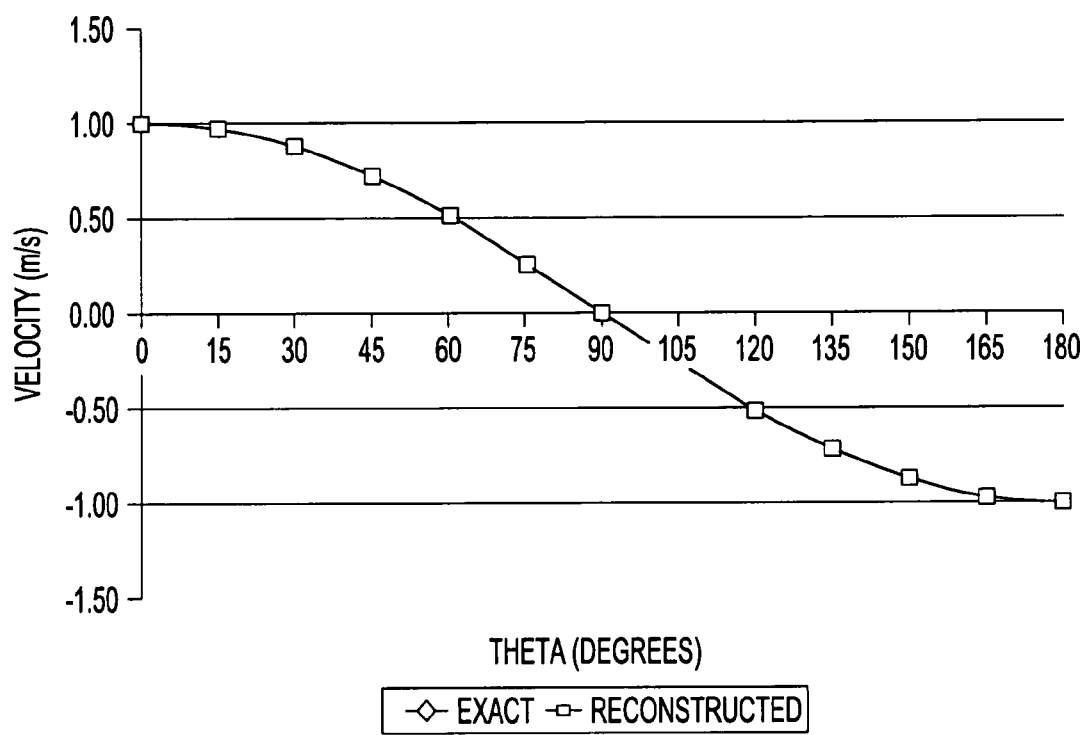
FIG. 4 is a comparison of the exact and reconstructed normal surface velocity distributions on the surface of an impulsively accelerated sphere.
Figure 5:
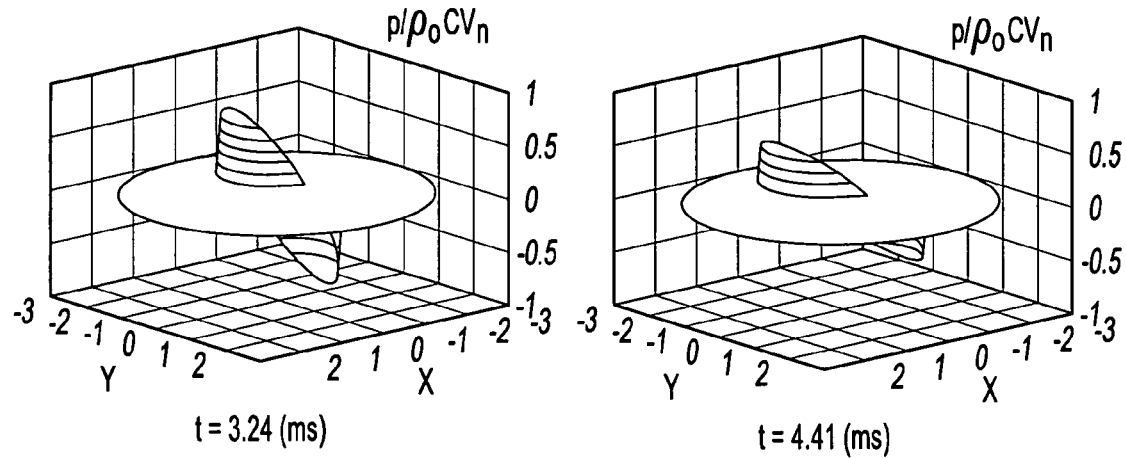
FIG. 5 shows the transient acoustic pressure fields generated by an impulsively accelerated sphere.
Figure 5:
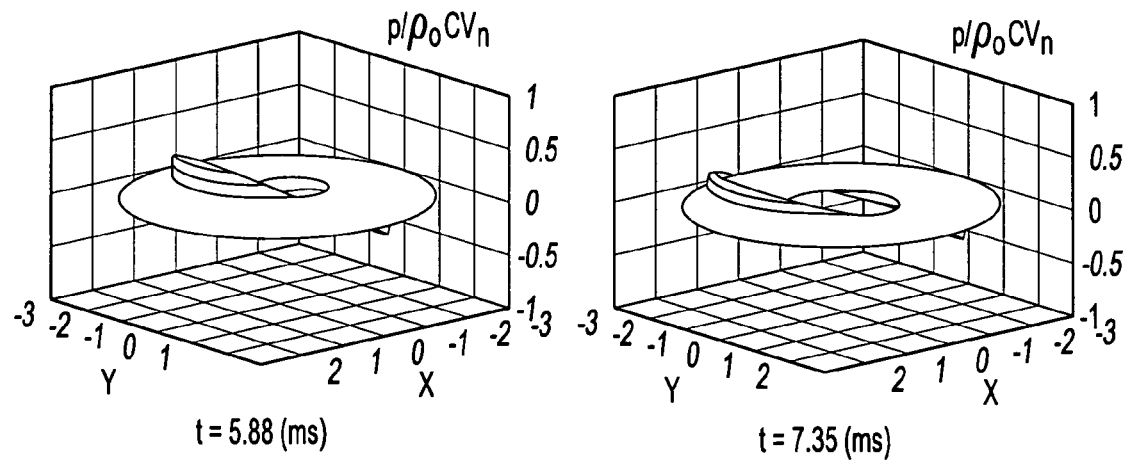

The reconstructed normal component of velocity is displayed in FIG. 4, which agrees very well with the analytic value. Numerical results indicate that theoretically we can reconstruct the transient acoustic field generated by an impulsively accelerated sphere using four expansion functions only, which correspond to four measurements. This is because the first expansion term represents a monopole and the next three depict dipoles in (x,y,z)-axis directions, respectively. FIG. 5 illustrate the instantaneous acoustic pressure wave fronts at t=3.24 (ms), 4.41 (ms), 5.88 (ms), and 7.35 (ms) from the sphere impulsively accelerated at t=0 (sec).

Impulsively Accelerated Baffled Sphere

In this example, only a small portion of the surface is impulsively accelerated and the rest area is rigidly baffled. The resulting acoustic pressure field can be viewed as being produced by popping a champagne bottle in a free field. Mathematically, the normal component of the surface velocity is expressible as, $$v(r_0, \theta, t) = \hat{v}_0(r_0, \theta)[H(\theta + \theta_0) - H(\theta - \theta_0)]H(t - t_0), \quad (19)$$

where $2\theta_0$ is the vertex angle ($\theta_0 = 30°$) and $\hat{v}(r_s, \theta)$ is to be reconstructed.

The analytic solution for the radiated transient acoustic pressure is given in terms of an infinite series. The same procedures as described above are followed in reconstruction.

Figure 6:
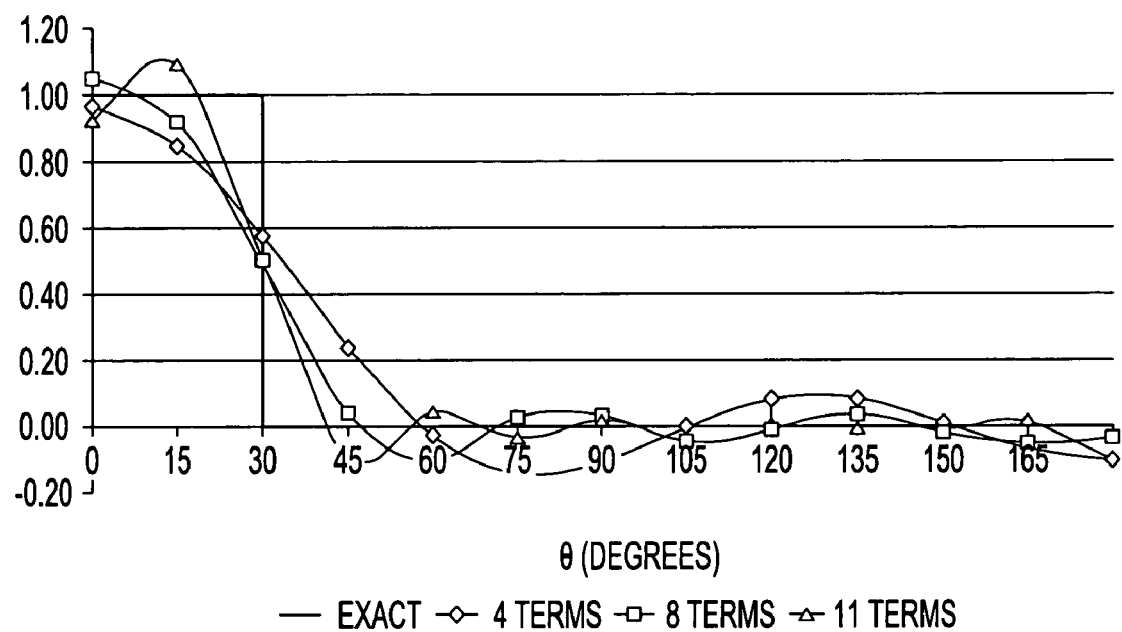
FIG. 6 is a comparison of the exact and reconstructed normal surface velocity distributions on the surface of an impulsively accelerated baffled sphere.

Table 3 displays comparison of analytic expansion coefficients and reconstructed values. Because of a rich content of high spatial frequencies, which is reflected in the presence of a sharp edge in the normal surface velocity given by Eq. (19), a large number of expansion functions are needed to approximate the velocity field. FIG. 6 displays the comparison of the exact normal surface velocity and reconstructed ones using different number of expansion functions. It is seen that solutions given by Eq. (8) converges to the exact normal surface velocity and the accuracy of reconstruction increases with the number of expansion functions. Theoretically, if input data are complete and error free, the reconstructed normal surface velocity may coverage to the true value as the number of expansion functions approaches infinity. However, this will never happen because in reality the measured data are always incomplete and inaccurate. Therefore, we rely on regularization to truncate the matrix in Eq. (8) so that errors in input data do not get amplified in the reconstruction process.

TABLE 3

Comparison of coefficients $\zeta_j$ for a partially impulsively accelerating baffled sphere.

| $\zeta_j$ | Reconstructed values | Analytic Values |
| --- | --- | --- |
| $\zeta_1$ | 6.69999E−02 | 6.70000E−02 |
| $\zeta_2$ | 1.87500E−01 | 1.87500E−01 |
| $\zeta_3$ | 2.70633E−01 | 2.70633E−01 |
| $\zeta_4$ | 3.00783E−01 | 3.00781E−01 |
| $\zeta_5$ | 2.74016E−01 | 2.74016E−01 |
| $\zeta_6$ | 1.98730E−01 | 1.98730E−01 |
| $\zeta_7$ | 9.34531E−02 | 9.34529E−02 |
| $\zeta_8$ | −1.76239E−02 | −1.76239E−02 |
| $\zeta_9$ | −1.10301E−01 | −1.10301E−01 |
| $\zeta_{10}$ | −1.65868E−01 | −1.65869E−01 |
| $\zeta_{11}$ | −1.75139E−01 | −1.75140E−01 |

Figure 7:
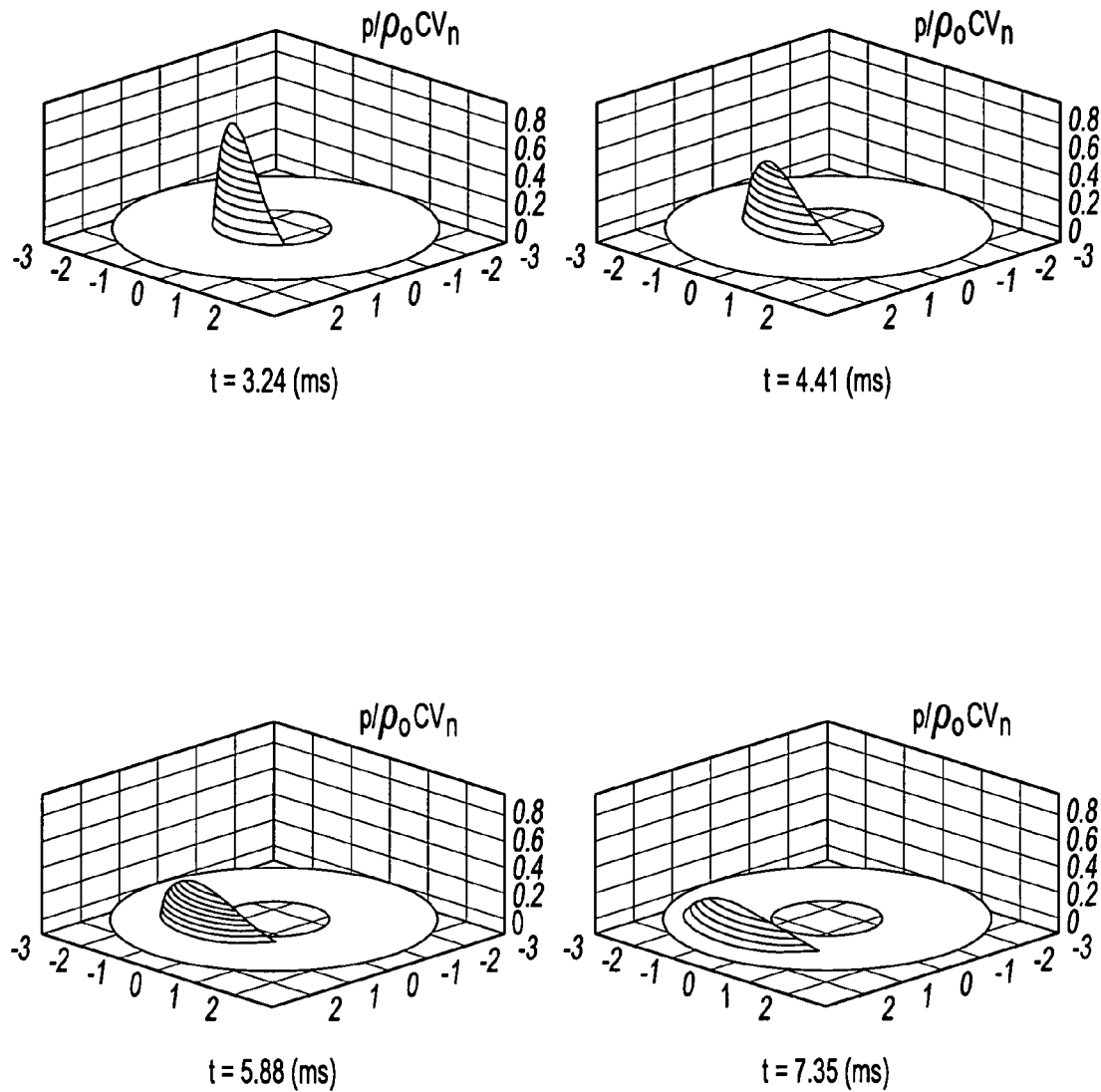
FIG. 7 shows the acoustic pressure fields generated by an impulsively accelerated baffled sphere.

Once the normal velocity on the surface is determined, the entire acoustic pressure field can be reconstructed using Eq. (7). FIG. 7 shows the transient acoustic pressures produced by an impulsively accelerating baffled sphere at different instants. Results indicate that the pressure pulse is produced primarily around the area where a velocity pulse is initiated and the amplitude becomes extremely low beyond certain polar angle.

CONCLUSIONS

General algorithms are developed for reconstructing transient acoustic radiation from a finite object in a free field. While examples shown are for a sphere, these algorithms are valid for an arbitrarily shaped object subject to arbitrarily time-dependent excitations. This is because the expansion functions used in these algorithms to describe the acoustic field are complete. These algorithms allow for an efficient and accurate reconstruction of a transient acoustic signal as it travels in space and time.

What is claimed is:

1. A method for reconstructing transient acoustic radiation from an object including the steps of:
   a) measuring transient acoustic pressure at a plurality of measurement points around the object subject to an arbitrarily time-dependent excitation; and
   b) reconstructing the transient acoustic pressure at points other than the measurement points based upon the measurements at the plurality of measurement points.

2. The method of claim 1 wherein the object is an arbitrarily shaped object.

3. The method of claim 1 wherein said step b) further includes the step of expanding the acoustic pressure in terms of the spherical Hankel functions.

4. The method of claim 1 wherein the transient acoustic pressure everywhere is determined in said step b).

5. The method of claim 1 wherein the transient acoustic pressure on a surface of the object is determined in said step b).

6. The method of claim 1 further including the step of using a Laplace transform having an s-domain.

7. The method of claim 6 further including the step of expressing the acoustic pressure in the s-domain as an expansion.

8. The method of claim 7 further including the step of expressing the acoustic pressure in the s-domain as an expansion in terms of spherical Hankel functions.

9. A system for reconstructing an acoustic field comprising:
   a plurality of transducers each measuring acoustic pressure at a measurement point around a noise source generating transient acoustic radiation; and
   a computer reconstructing transient acoustic pressure at points other than the measurement points based upon the acoustic pressure as measured by the transducers.

10. The system of claim 9 wherein the source is an arbitrarily shaped object.

11. The system of claim 9 wherein the computer expands the acoustic pressure in terms of spherical Hankel functions.

12. The system of claim 9 wherein the computer determines the transient acoustic pressure everywhere.

13. The system of claim 9 wherein the computer determines the transient acoustic pressure on a surface of the source.

14. The system of claim 9 wherein the computer uses a Laplace transform having an s-domain to reconstruct the transient acoustic pressure.

15. The system of claim 14 wherein the computer expresses the acoustic pressure in the s-domain as an expansion.

16. The system of claim 15 wherein the computer expresses the acoustic pressure in the s-domain as an expansion in terms of spherical Hankel functions.

17. A computer-readable storage medium having a computer program stored thereon, which when executed by a computer performs the steps of:
   a) receiving signals indicating sound at a plurality of measurement points around a noise source generating transient acoustic radiation; and
   b) reconstructing a transient acoustic field at points other than the measurement points based upon the signals.

18. A system for reconstructing an acoustic field comprising:
   a plurality of transducers each measuring acoustic pressure at a measurement point around a noise source generating transient acoustic radiation; and
   means for reconstructing transient acoustic pressure at points other than the measurement points based upon the acoustic pressure as measured by the transducers.

* * * * *